(12) United States Patent
Kitazoe et al.

(10) Patent No.: US 6,667,075 B2
(45) Date of Patent: Dec. 23, 2003

(54) METHOD FOR IMPARTING HYDROPHILICITY TO SUBSTRATE

(75) Inventors: Toshiaki Kitazoe, Osaka (JP); Keisuke Tanaka, Osaka (JP); Kenji Murata, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 10/110,642

(22) PCT Filed: Apr. 27, 2001

(86) PCT No.: PCT/JP01/03733

§ 371 (c)(1),
(2), (4) Date: Apr. 12, 2002

(87) PCT Pub. No.: WO01/87789

PCT Pub. Date: Nov. 22, 2001

(65) Prior Publication Data

US 2002/0192365 A1 Dec. 19, 2002

(30) Foreign Application Priority Data

May 16, 2000 (JP) ........................................ 2000-143280
Oct. 19, 2000 (JP) ........................................ 2000-319178

(51) Int. Cl.⁷ ................................................. B05D 3/10
(52) U.S. Cl. ...................... 427/341; 427/344; 427/354; 427/419.4
(58) Field of Search ................................ 427/341, 342, 427/343, 344, 353, 354, 419.2, 419.3, 419.4

(56) References Cited

U.S. PATENT DOCUMENTS

| | | | | |
|---|---|---|---|---|
| 5,145,723 A | * | 9/1992 | Ballance et al. | 427/397.7 |
| 5,891,556 A | | 4/1999 | Anderson et al. | 428/216 |
| 2001/0031364 A1 | * | 10/2001 | Ogawa et al. | |

FOREIGN PATENT DOCUMENTS

| | | | |
|---|---|---|---|
| GB | 2361246 | * | 6/2000 |
| JP | 60-096682 | | 5/1985 |
| JP | 61-091042 | | 5/1986 |
| JP | 02-022341 | * | 1/1990 |
| JP | 02-022342 | * | 1/1990 |
| JP | 02-022343 | * | 1/1990 |
| JP | 02-296752 | | 12/1990 |
| JP | 02-311336 | | 12/1990 |
| JP | 03-208837 | | 9/1991 |
| JP | 05-230249 | * | 9/1993 |
| JP | 08-151235 | | 6/1996 |
| JP | 10-044300 | | 2/1998 |
| JP | 2000-117875 | * | 4/2000 |

OTHER PUBLICATIONS

Takabayashi et al, Report s of the Toyama Industrial Technology Center, 15, pp 1.10–1.11, 2001.*

Momii et al, Asahi Garasu Kenkyu Hokoku, 51, pp 47–50, 2001.*

Miyashita et al, Journal of Materials Science, 36(16), pp 3877–3884, 2001.*

* cited by examiner

*Primary Examiner*—Erma Cameron
(74) *Attorney, Agent, or Firm*—Merchant & Gould P.C.

(57) ABSTRACT

The present invention relates to a method for imparting hydrophilicity to a substrate whereby high hydrophilic properties and water-holding properties can be maintained for a long period of time. According to the present invention, an $SiO_2$ film is formed directly or through an undercoat layer on a substrate under a reduced pressure of 100 Pa or less and immediately after the $SiO_2$ film is formed, the $SiO_2$ film is treated with water. Before forming the $SiO_2$ film, it is also desirable that an undercoat layer consisting of a $TiO_2$ film, $Al_2O_3$ film, $Nb_2O_5$ film, a laminated film prepared by laminating the $TiO_2$ film on the $Al_2O_3$ film, a laminated film prepared by laminating the $TiO_2$ film on the $Nb_2O_5$ film, or a low emissivity film be formed on a substrate and the $SiO_2$ film be then formed on the undercoat film to serve as an $SiO_2$ composite film.

13 Claims, No Drawings

METHOD FOR IMPARTING HYDROPHILICITY TO SUBSTRATE

TECHNICAL FIELD

The present invention relates to a method for imparting hydrophilicity to a substrate whereby high hydrophilic properties and water-holding properties can be maintained for a long period of time.

BACKGROUND TECHNIQUE

Various measures such as the use of defogging mirrors or eyeglasses have been taken to prevent fog due to vapor or rain. For example, there is a method for applying a surface active agent to the surface of a glass or lens (hereinafter referred to as "substrate"), a method for applying a water absorbing agent to the surface of the substrate, a method for applying a water repellent agent to the surface of the substrate, or a method for coating the surface of the substrate with inorganic hydrophilic substance by a wet method.

In the method for applying the surface active agent to the surface of the substrate, by positioning a hydrophilic group on the surface of the substrate, a water screen is uniformly leveled without water adhering to produce a defogging effect.

The method for applying the water absorbing agent to the surface of the substrate is to produce a defogging effect by causing water adhering to the surface of the material to be absorbed by the water absorbing agent.

In the method for applying the water repellent agent to the surface of the substrate, by providing a coating such as a fluoroethylene resin whose surface tension is less on the substrate to increase the contact angle of water droplets, water adhering to the surface is repelled to produce a defogging effect.

In the method for coating the surface of the substrate with an inorganic hydrophilic substance, by providing a hydrophilic thin film with a small contact angle for the water droplets on the surface of the substrate, the water screen is made uniformly level without water adhering to produce a defogging effect, wherein a wet method such as a sol-gel method or a spin coat method is adopted as a coating process.

DISCLOSURE OF THE INVENTION

In the method for applying the surface active agent, there is a problem that the surface active agent cannot be used for a long time because it is easily swept away by water.

In the method for applying the water absorbing agent, there is a problem that the water absorbing agent cannot withstand long term use because it will soon be saturated if there is a lot of water or if an extremely thick water absorbing agent coating is required to allow the water absorbing agent to exhibit a water absorbing effect to some extent and as a result, the reflected image is distorted, or the water absorbing agent exhibits inferior flaw resistance because of the presence of an organic material.

In the method for applying the water repellent agent, there is a problem that though the water repellent agent repels water, it does not have sufficient defogging properties to repel even minute water droplet and it is difficult to maintain the defogging property for a long time.

Further, in the method for coating with an inorganic hydrophilic substance, there is a problem that uniform coating is not possible over a large area such as a mirror because it is difficult to control the coating thickness in the order of nm. It is complicated because there is a plurality of treating processes such as spraying of coating solution and burning, and it is difficult to maintain the defogging properties for a long time because the mechanical strength on the coating surface is insufficient.

To solve the above-mentioned problems, according to the present invention, an $SiO_2$ film is formed directly or through an undercoat layer on a substrate under a reduced pressure of 100 Pa or less and immediately after the $SiO_2$ film is formed, the $SiO_2$ film is treated with water to selectively form silanol groups (SiOH) on the surface of the $SiO_2$ film. The silanol groups (SiOH) formed on the $SiO_2$ film exhibit hydrophilic properties.

In the present invention, the term "$SiO_2$ film" is used to clearly express a silicon dioxide film, but this also includes a film in which the ratio of an Si atom to an O atom is not always 1:2 stoichiometrically. This also applies to an $SnO_2$ film.

A $TiO_2$ film, an $Al_2O_3$ film, a $Nb_2O_5$ film, a laminated film prepared by laminating the $TiO_2$ film on the $Nb_2O_5$ film, or a low emissivity film is desirable as the undercoat layer. In this case, it is desirable that another SiO2 film be formed between the undercoat layer and the substrate. It is also desirable that the $SnO_2$ film be selected as a structure for the low emissivity film. If the $SnO_2$ film which is formed through a laminated film prepared by laminating the $SnO_2$ film and the $SiO_2$ film on the substrate in turn by a CVD method is selected, it is possible not only to decrease an interference reflected color of a thin film, but also to prevent seepage of alkalis (Na) from a glass substrate.

An SiN film is also effective as the undercoat layer provided to prevent seepage of the alkalis (Na). A thickness of 1~20 nm is desirable for the SiN film.

As described above, the $SiO_2$ film is formed under a reduced pressure of 100 Pa or less. However, there is a method for forming the $SiO_2$ film by a plasma CVD under an atmosphere of 100~1 Pa of which the main components are silane gas and oxidizing gas, a method for forming the $SiO_2$ film by sputtering under a reduced pressure of 10~0.1 Pa, or a method for forming the $SiO_2$ film by vacuum deposition under a reduced pressure of 1 Pa or less, or the like. Above all, the method for forming the $SiO_2$ film by sputtering is most excellent as a method for treating a larger area. When the $SiO_2$ film is formed by sputtering an Si target under an oxygen atmosphere, if 1~400% (preferably 1~200%, more preferably 60~80%) of argon or nitrogen is mixed relative to the oxygen in an oxygen atmospheric gas, it is possible to selectively form a silanol group by providing a large oxygen deficiency on the surface of the $SiO_2$ film.

In the case where a glass substrate is selected for the substrate, it is also possible to obtain a hydrophilic treating surface by burning, after the water treatment to form silanol groups, the glass substrate at a temperature of 300~500° C. under an atmospheric pressure in which 0~400% of nitrogen is provided relative to air. In this manner, it is possible to remove any organic substance adhering to the surface which would become water repellent component and to form a highly hydrophilic film.

It is also desirable that 0.1~20% by weight of Al component be used to dope an Si component in the $SiO_2$ film. In this manner, adsorption of water on the silanol group is stabilized and a film with high water-holding properties can be formed.

Further, it is desirable that the substrate have transparency or mirror reflection and the transparency or the mirror reflection be maintained even after the hydrophilic treatment.

PREFERRED EMBODIMENTS FOR WORKING THE INVENTION

Preferred embodiments of the present invention will now be explained hereunder.

In a method for imparting hydrophilic properties to a substrate according to the present invention, an $SiO_2$ film is formed on the substrate by a film-forming method under a reduced pressure and immediately after formation thereof, the $SiO_2$ film is treated with water. There is no specific limit to the material for the substrate used in the present invention as far as required to provide the substrate with a defogging function, hydrophilic function or water-holding function. For example, a suitable material includes glass, a mirror, a lens (including a plastic lens), tile or an aluminum panel.

As methods for forming an $SiO_2$ film on the substrate under a reduced pressure of 100 Pa or less, there are a plasma CVD method, a sputtering method, a vacuum deposition method and the like. The reason why a silanol group is formed by performing water treatment immediately after an $SiO_2$ film is formed under a highly reduced pressure is because water reacts before chemical adsorption of an organic substance onto the surface of chemically unstable $SiO_2$ film formed by a film forming method under reduced pressure, oxidation at a surface-active site, or connection of an organic substance at the active site is generated and therefore the silanol group which contributes to the hydrophilic properties is easily formed.

In particular, since the method for sputtering Si as a target in an oxygen atmosphere under a highly reduced pressure can form many active sites on the surface of the substrate, if this is combined with the water treatment immediately after the formation of the film, it is possible to form a large number of silanol groups (SiOH) with highly hydrophilic properties on the surface of the $SiO_2$ film.

By forming a large number of silanol groups on the surface of the $SiO_2$ film, the treated material can exhibit highly hydrophilic properties and water-holding properties. Since the Si of the silanol group when formed by the sputtering method is firmly coated on the surface of the substrate, it is possible to maintain the hydrophilic properties and water-holding properties for a long time.

Non-deionized water may be used in the water treatment. However, it is desirable that distilled water, pure water, or acid solution adjusted by adding an inorganic acid such as hydrochloric acid, sulfuric acid, nitric acid or phosphoric acid, or an organic acid such as acetic acid, butyric acid or lactic acid to the pure water, or an alkaline solution adjusted by adding a base such as sodium hydroxide, potassium hydroxide or ammonium hydroxide to the pure water be used. As a method for water treatment, there is a method for dipping a material formed with an $SiO_2$ film in water or a method for passing the material through water vapor, a method for spraying on the material, or the like.

As an atmospheric gas in the case where the $SiO_2$ film is formed, silane gas of 100~1 Pa and an oxidizing gas or the oxidizing gas mixed with rare gas or hydrogen gas are used in the plasma CVD. In the vacuum deposition method, there is a method for depositing an $SiO_2$ source by reducing the atmospheric pressure to 0.1 Pa or less, or a method for utilizing an SiOx (X=0~2) source under an atmosphere of gaseous oxygen of 1~0.1 Pa or the rare gas or mixed gas thereof.

An atmospheric gas used in the sputtering method may be gaseous oxygen alone, but a method for mixing 1~400% by volume, preferably 1~200% by volume, more preferably 60~80% by volume of argon gas and/or nitrogen gas relative to oxygen may be used. When the mixed gas is used, an SiOx suboxide film is formed and oxygen deficiency, i.e. a large number of active sites exist on the surface of the SiOx suboxide film. As a result, it is possible to form a large number of silanol groups.

Further, as an other means for forming a large number of silanol groups, before forming the $SiO_2$ film, it is also desirable that an undercoat layer consisting of a $TiO_2$ film, $Al_2O_3$ film, $Nb_2O_5$ film, a laminated film prepared by laminating the $TiO_2$ film on the $Al_2O_3$ film, a laminated film prepared by laminating the $TiO_2$ film on the $Nb_2O_5$ film, or a low emissivity film be formed on a substrate and the $SiO_2$ film be then formed on the undercoat film to serve as an $SiO_2$ composite film. The undercoat layer has a function of imparting adhesion between the $SiO_2$ film and the substrate, to improve durability of the film and to adjust the surface irregularity. By treating the composite film with water, it is possible to selectively form the silanol group.

It is also desirable that Al be mixed with Si material in advance when an $SiO_2$ film is formed or 0.1~20% by weight, preferably 1~10% by weight of an Al component be doped relative to an Si component of the $SiO_2$ film by the treatment after formation of the silanol group by water treatment. Since the Al component is doped, adsorption conditions of water to the silanol group are stabilized and as a result, the water-holding properties of the $SiO_2$ film can be improved.

In this ease, it is desirable that another SiO2 film be formed between the undercoat layer and the substrate. It is also desirable that an $SnO_2$ film be selected as a low emissivity film. If the $SnO_2$ film formed through a laminated film prepared by laminating the $SnO_2$ film and $SiO_2$ film on the substrate in turn by a CVD method is selected, it is also possible to decrease interference of reflected color of a thin film and to prevent seepage of alkali (Na) from a glass substrate.

It is also effective to form an SiN film of a thickness of 1~20 nm as the undercoat layer for the purpose of preventing seepage of alkali (Na) from the glass substrate.

In the case where the substrate is composed of glass material, it is desirable that the substrate be burned at a temperature of 300~500° C. after the water treatment to form silanol groups in an atmosphere in which 0~100% of nitrogen is mixed relative to air. With this burning, it is possible to remove organic substances adhering to the surface which becomes a repellant component and to improve the hydrophilic properties.

The thickness of the $SiO_2$ film formed by the treating method of the present invention is adjusted to 1~100 nm, preferably 1~65 nm. The reason for this is that in the case of acid solution for water treatment to form a silanol group on the $SiO_2$ film.

The contact angle of a water droplet on a test panel prepared by the above method was measured. As a result, the contact angle was 2° and had highly hydrophilic properties. This test panel was left in a room for 27 days. The contact angle of the water droplet was measured again after 27 days and, as a result, the same angle (2°) as before was found, confirming that highly hydrophilic properties could be maintained for a long time. The results are shown in Table 1. A method for measuring the contact angle of a water droplet is described below.

TABLE 1

| No. | Undercoat layer | Gas composition ($O_2$/Ar) | $SiO_2$ film thickness | Water treatment | Water droplet contact angle (°) | |
|---|---|---|---|---|---|---|
| | | | | | 0 day | 27th day |
| Embodiment 1 | $TiO_2$ (500 nm) | 100/70 | 10 nm | Acid water | 2 | 2 |
| 2 | Low emissivity film (400 nm) | 100/70 | 10 nm | Acid water | 2 | 9 |
| 3 | Low emissivity film (400 nm) | 100/70 | CVD10 nm | Acid water | 2 | 13 |
| 4 | Nil | 100/70 | 15 nm | Acid water | 2 | 20 |
| 5 | Nil | 100/70 | 65 nm | Acid water | 2 | 14 |
| 6 | Nil | — | Wet method 100 nm | Acid water | 3 | 17 |
| 7 | $Nb_2O_5$ (10 nm) $TiO_2$ (250 nm) | 100/70 | 7 nm | Acid water | 2 | 13 |
| 8 | $Nb_2O_5$ (10 nm) | 100/70 | 15 nm | Acid water | 2 | 15 |
| 9 | SiN (10 nm) | 100/70 | 45 nm | Acid water | 2 | 15 |
| 10 | $SiO_2$ (100 nm) | 100/70 | 5 nm | Acid water | 2 | 13 |
| Comparative example 1 | Nil | 100/0 | 15 nm | Nil | 2 | 32 |
| 2 | Only low emissivity film (400 nm) | — | Nil | Nil | 2 | 34 |
| 3 | Float glass of 3 mm | — | Nil | Nil | 2 | 38 |
| 4 | $TiO_2$ (500 nm) | — | Nil | Nil | 2 | 40 |

(Embodiments 2~9 and Comparative examples 1~4)

under 1 nm, it is not possible to sufficiently exhibit the hydrophilic properties and even though the thickness is over 100 nm, it is not possible to expect an increased effect.

A film with a thickness of this range formed by the sputtering method is very flat compared with the plasma CVD method or the vacuum deposition method, and the hydrophilic properties can be improved. The sputtering method also has a characteristic in that uniform hydrophilic film can be formed even on a substrate with a large area such as a mirror.

EMBODIMENTS AND COMPARATIVE EXAMPLES

The present invention will now be described with reference to specific embodiments and comparative examples.

Embodiment 1

A test substrate is prepared by cutting a float glass at 150 mm×150 mm. An undercoat layer of titanium oxide with a thickness of 500 nm is formed on the substrate by a sputtering method in an oxygen atmosphere.

Next, an $SiO_2$ film of a thickness of 10 nm is formed on the undercoat layer by the sputtering method in the oxygen atmosphere and immediately after that, it is dipped in the Test panels were prepared in the same manner as the embodiment 1 except that the undercoat layer, gas composition, $SiO_2$ film thickness, and water treatment conditions of the embodiment 1 were changed as shown in Table 1. These results are shown in Table 1.

Embodiment 10

A test substrate is prepared by cutting a float glass at 150 mm×150 mm. This substrate was dipped in a 30% solution of $H_2SiF_6$ for 90 minutes to form an $SiO_2$ undercoat film of a thickness of 100 nm.

Next, an $SiO_2$ film of a thickness of 5 nm was formed on the undercoat film by a sputtering method in an oxygen atmosphere and then dipped in an acid solution for water treatment, thereby forming a silanol group on the $SiO_2$ film.

Embodiment 11

A test substrate was prepared by cutting a float glass at 150 mm×150 mm. An $SiO_2$ film of a thickness of 15 nm was formed on the substrate by a sputtering method in a mixed atmosphere of oxygen and argon ($O_2$/Ar % by volume=100/70).

The $SiO_2$ film, once formed, is then dipped in an acid solution for water treatment to form a silanol group on the $SiO_2$ film. Treatment conditions are shown in Table 2.

TABLE 2

| No. | Substrate kind | Undercoat layer | Gas composition (O$_2$/Ar) | SiO$_2$ film thickness | Water treatment | Al dope |
|---|---|---|---|---|---|---|
| Embodiment 11 | Float glass of 3 mm | Nil | 100/70 | 15 nm | Yes | Nil |
| 12 | Mirror of 5 mm | Nil | 100/70 | 7 nm | Yes | Nil |
| 13 | Float glass of 3 mm | Yes | 100/70 | 7 nm | Yes | 8 wt % |
| 14 | Float glass of 5 mm | Nil | 100/70 | 5 nm | Yes | 8 wt % |
| 15 | Float glass of 5 mm | Nil | 100/70 | 1 nm | Yes | 8 wt % |
| Comparative example 5 | Float glass of 3 mm | Nil | 100/70 | 15 nm | Nil | 6 wt % |
| 6 | Float glass of 5 mm | Nil | 100/40 | 15 nm | Nil | 6 wt % |
| 7 | Float glass of 3 mm | Nil | 100/80 | 15 nm | Nil | 6 wt % |
| 8 | Float glass of 3 mm | Nil | 100/60 | 15 nm | Nil | 6 wt % |

The test panels prepared by the above-mentioned method were carefully maintained in a room in an inclined and fixed condition. Water was sprayed on the panels on every date shown in Table 3 and the wetting degree of the surface after 60 seconds was visually observed and evaluated. In the case where the surface is covered with dust and wettability is affected, the surface is wiped with a non-woven fabric cloth for further evaluation. Evaluation criteria are as follows:

| | |
|---|---|
| ⊚ | More than 80% of the total area is wet. |
| ○ | 50~80% of the total area is wet. |
| Δ | 20~40% of the total area is wet. |
| X | Wetting area is under 20% of the total area. |

Evaluation results are shown in Table 3.

TABLE 3

| | Hydrophilic property evaluation | | | | | | | | |
|---|---|---|---|---|---|---|---|---|---|
| No. | 1$^{st}$ day | 3$^{rd}$ day | 6$^{th}$ day | 11$^{th}$ day | 16$^{th}$ day | 25$^{th}$ day | 29$^{th}$ day | 47$^{th}$ day | 51$^{st}$ day |
| Embodiment 11 | ⊚ | ⊚ | ⊚ | — | ⊚ | — | ⊚ | — | ○ |
| 12 | ⊚ | ⊚ | ⊚ | — | ⊚ | — | ⊚ | — | ⊚ |
| 13 | ⊚ | — | ⊚ | ⊚ | ⊚ | — | ⊚ | — | ⊚ |
| 14 | ⊚ | — | ⊚ | ⊚ | ⊚ | — | ⊚ | — | ⊚ |
| 15 | ⊚ | — | ⊚ | ⊚ | ⊚ | — | ○ | — | ○ |
| Comparative example 5 | ○ | ○ | Δ | — | ○ | — | Δ | — | Δ |
| 6 | Δ | X | X Stopped | | | | | | |
| 7 | ○ | ○ | Δ | — | Δ | — | X | — | Δ |
| 8 | ○ | ○ | Δ | — | Δ | — | Δ | — | Δ |

(Embodiments 12~15 and Comparative Examples 5~8)

Each test panel was prepared and evaluated in the same manner as in the embodiment 11 except that the substrate kind, the undercoat layer, the gas composition, the SiO$_2$ film thickness, with or without water treatment, and with or without Al dope were changed. Each condition is shown in Table 2 and evaluation results are shown in Table 3.

INDUSTRIAL APPLICABILITY

As described above, according to the present invention, immediately after an SiO$_2$ film is formed on the substrate under a reduced pressure of 100 Pa or less, the SiO$_2$ film is treated with water to selectively form a silanol group (SiOH) on the surface of the SiO$_2$ film. Accordingly, it is possible to maintain highly hydrophilic properties and water-holding properties for a long time without affecting the optical function and outer appearance of the substrate itself after a defogging treatment.

Accordingly, the substrate obtained by the method of the present invention can be expected to provide a fog prevention effect for improving visibility in a high temperature and highly humid atmosphere and can be suitably applied to defogging mirror or window in a bath room or the like. Also, since the SiO$_2$ film formed has an extremely small contact angle with water, it has the effect of removing any fouling composition contained in the water together with a water stream without retaining the fouling composition on the substrate. Accordingly, it is possible to prevent fouling of the glass or panel.

Further, in the case where the glass substrate is used, the refraction factor between the SiO$_2$ film formed and the substrate is almost the same. Accordingly, there is no optical strain and transparency is also high. In the case where the sputtering method is used as a method for forming the SiO$_2$ film, since control of the film thickness in the order of several nm is possible, it is possible to obtain material with a larger area having a uniform SiO$_2$ film.

What is claimed is:

1. A method for imparting to a substrate comprising the steps of forming an SiO$_2$ film directly or through an undercoat layer on the substrate under a reduced pressure of 100 Pa or less, treating the SiO$_2$ film with water immediately after formation of the film and forming silanol groups (SiOH) on the surface of the SiO$_2$ film.

2. The method for imparting hydrophilicity to a substrate according to claim 1, wherein the undercoat layer is selected from the group consisting of a TiO$_2$ film, an Al$_2$O$_3$ film, a Nb$_2$O$_5$ film, a laminated film prepared by laminating the TiO$_2$ film on the Al$_2$O$_3$ film, a laminated film prepared by laminating the TiO$_2$ film on the Nb$_2$O$_5$ film, or a low emissivity film.

3. The method for imparting hydrophilicity to a substrate according to claim 2, wherein the low emissivity film comprises a $SnO_2$ film.

4. The method for imparting hydrophilicity to a substrate according to claim 1, wherein another SiO2 film is formed between the undercoat layer and the substrate.

5. The method for imparting hydrophilicity to a substrate according to claim 3, wherein a laminated film comprising another $SiO_2$ film on another $SnO_2$ film is formed between the $SnO_2$ film undercoat layer and the substrate.

6. The method for imparting hydrophilicity to a substrate according to claim 1, wherein the undercoat layer comprises an SiN film.

7. The method for imparting hydrophilicity to a substrate according to claim 6, wherein the thickness of the SiN film is 1~20 nm.

8. The method for imparting hydrophilicity to a substrate according to claim 1, wherein the reduced pressure of 100 Pa or less is characterized in that 1~400% of argon or nitrogen is mixed relative to oxygen in oxygen atmospheric gas.

9. The method for imparting hydrophilicity to a substrate according to claim 1, wherein the thickness of the $SiO_2$ film is performed by sputtering an Si target.

10. The method for imparting hydrophilicity to a substrate according to claim 1, wherein the thickness of the SiO2 film is 1~100 nm.

11. The method for imparting hydrophilicity to a substrate according to claim 1, wherein the substrate is a glass substrate which is burned after the water treatment at a temperature of 300~500° C. under an atmosphere in which 0~100% nitrogen is mixed relative to air.

12. The method for imparting hydrophilicity to a substrate according to claim 1, wherein 0.1~20% by weight of an Al component is doped relative to an Si component in the $SiO_2$ film.

13. The method for imparting hydrophilicity to a substrate according to claim 1, wherein the substrate provides transparency or a mirror reflection and the transparency or mirror reflection can still be maintained after the hydrophilic treatment.

* * * * *